United States Patent
Maixner

(10) Patent No.: US 10,429,462 B2
(45) Date of Patent: Oct. 1, 2019

(54) OUTPUT STAGE FOR THE GENERATION OF VARIABLE SQUARE-WAVE CURRENTS IN AN INDUCTIVE LOAD WITH NO HIGH-VOLTAGE SUPPLY

(71) Applicant: Bruker BioSpin GmbH, Rheinstetten (DE)

(72) Inventor: Michael Maixner, Bietigheim (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 0 days.

(21) Appl. No.: 16/050,715

(22) Filed: Jul. 31, 2018

(65) Prior Publication Data
US 2019/0033406 A1    Jan. 31, 2019

(30) Foreign Application Priority Data
Jul. 31, 2017    (DE) .................. 10 2017 213 197

(51) Int. Cl.
| *G01R 33/385* | (2006.01) |
| *G01R 33/54* | (2006.01) |
| *G01R 33/565* | (2006.01) |

(52) U.S. Cl.
CPC ....... *G01R 33/3852* (2013.01); *G01R 33/543* (2013.01); *G01R 33/56572* (2013.01)

(58) Field of Classification Search
CPC .............. G01R 33/385; G01R 33/3852; G01R 33/543; G01R 33/56572; A61B 5/055
See application file for complete search history.

(56) References Cited

U.S. PATENT DOCUMENTS

| 2,941,125 A | 6/1960 | Lippincott |
| 4,644,282 A | 2/1987 | Kestler |
| 4,961,054 A | 10/1990 | Park et al. |
| 5,105,153 A | 4/1992 | Mueller et al. |
| 5,270,657 A | 12/1993 | Wirth et al. |
| 5,311,136 A | 5/1994 | Takahashi |

(Continued)

FOREIGN PATENT DOCUMENTS

| DE | 3336286 A1 | 4/1985 |
| JP | H04231026 A | 8/1992 |

(Continued)

OTHER PUBLICATIONS

Office Action in corresponding German Application 102017213197.7, dated Apr. 19, 2018, along with English Translation.

*Primary Examiner* — Rishi R Patel
(74) *Attorney, Agent, or Firm* — Edell, Shapiro & Finnan, LLC

(57) ABSTRACT

A magnetic resonance (MR) device, having a gradient arrangement that includes a gradient coil (G) with an internal resistance (Rg), as well as an electric circuit for generating variable pulse-shaped currents through the gradient arrangement. The electric circuit has at least one low-voltage voltage source (V) for generating a voltage U≤100V, and a first circuit section in the electric circuit for current in the gradient coil in one direction and a second circuit section in the electric circuit for current in the gradient coil in a reverse direction to the first circuit section. This permits the generation of accurate square-wave current pulses, with a simultaneously short charging time of the auxiliary inductance.

15 Claims, 4 Drawing Sheets

(56) References Cited

U.S. PATENT DOCUMENTS

| | | | |
|---|---|---|---|
| 6,154,031 A | 11/2000 | Hughes | |
| 6,900,638 B1 * | 5/2005 | Yair | ............ G01R 33/3852 324/309 |
| 2006/0152222 A1 | 7/2006 | Trabbic et al. | |

FOREIGN PATENT DOCUMENTS

| JP | H05269102 A | 10/1993 |
|---|---|---|
| JP | H08211139 A | 8/1996 |
| JP | 2001516244 A | 9/2001 |

* cited by examiner

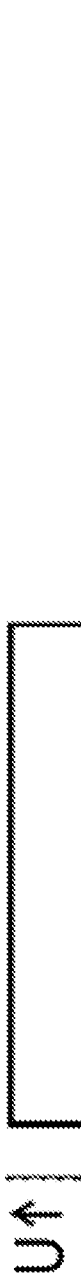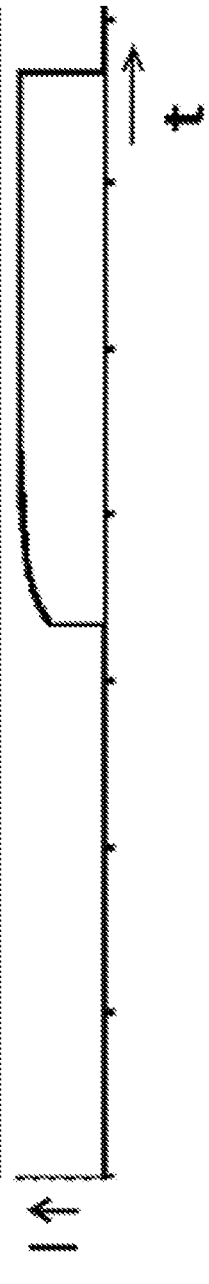

OUTPUT STAGE FOR THE GENERATION OF VARIABLE SQUARE-WAVE CURRENTS IN AN INDUCTIVE LOAD WITH NO HIGH-VOLTAGE SUPPLY

CROSS REFERENCE TO RELATED APPLICATIONS

This application claims foreign priority under 35 U.S.C. § 119(a)-(d) to German Application No. 10 2017 213 197.7 filed on Jul. 31, 2017, the entire contents of which are hereby incorporated into the present application by reference.

FIELD OF THE INVENTION

The present invention relates to a magnetic resonance device having a main field magnet for the generation of a uniform magnetic field in a measuring volume, with a gradient arrangement for the generation of magnetic field gradients in said measuring volume, incorporating at least one gradient coil with an internal resistance, and having an electric circuit for the generation of variable pulse-shaped currents through the gradient arrangement, incorporating a first switching element which is series-connected to a first resistor, by means of which a current can only be switched-on or switched-off in a first auxiliary coil, and wherein the electric circuit incorporates a second switching element, by means of which a serial current flux can be switched through the gradient coil and the first auxiliary coil.

BACKGROUND

In general, an aspect of the present invention relates to the field of magnetic resonance (MR) in which appropriate magnet systems are employed, which are designed to generate uniform magnetic fields for MR measurements. However, the applicability of the invention is not limited to this field.

In both nuclear magnetic resonance spectroscopy (NMR) and in imaging applications (MRI), within a specific sample volume, an exceptionally uniform and temporally constant magnetic field is required, which can be generated by resistive or superconducting coils, or by an appropriate permanent magnet arrangement. Magnetic resonance imaging (MRI) methods are extensively employed for the acquisition of image information on structures. Using these methods, it is possible to obtain image information from the interior of a structure without damaging said structure. In clinical applications, for example, internal images of the organs of human beings and animals can be generated using MRI methods. In currently employed MRI methods, precision movements of nuclear spin are characterized by the temporally-varied superimposition of additional location-related magnetic fields for all three spatial directions in a spatial coding system, generally described as spatial encoding. Within the investigated object, these additional magnetic fields customarily show essentially constant gradients for the z-components in the spatial directions x, y and z, and are generated by a coil arrangement which is designated as a gradient system, and are actuated by a "gradient channel" for each respective spatial direction.

The generation of a gradient is achieved in that a pulse-shaped current is delivered by a gradient coil, which varies the static magnetic field on the investigated object. As described, for example, in US 2006/0152222 A1, an increased voltage, of up to several hundred volts, is applied to the gradient coil, as a result of which the current rises more rapidly such that, once the desired current strength is achieved, a switchover to a lower voltage is effected, in order to reduce the power loss in the gradient amplifier. In the first case, however, a high voltage is required, albeit for only a short time, which must still be available in reserve in the gradient amplifier circuit.

In electrotechnical circuit theory and network analysis, a current source describes an active two-terminal circuit which delivers an electric current at its terminal points. As an important property, this current is only dependent to a limited extent or, in the model of an ideal current source in the context of circuit analysis, is not at all dependent upon the electrical voltage at the terminal points thereof.

In electrotechnical circuit theory, a voltage source describes an active two-terminal circuit which delivers an electrical voltage between its terminal points. As an important property, this voltage is only dependent to a limited extent or, in the model of an ideal voltage source in the context of network analysis, is not at all dependent upon the electric current which is tapped from the source.

The above-mentioned US 2006/0152222 A1 discloses a gradient circuit with an amplifier circuit of conventional operation, wherein the gradient amplifier comprises a plurality of switching current controllers, which are electrically connected in series. A bipolar circuit receives power from the associated series circuit power controller and delivers power, with the preferred polarity, to the gradient coil.

DE 33 36 286 A1 constitutes an alternative to the arrangement described in US 2006/0152222 A1. However, the current source employed therein, which has a high output resistance and delivers a constant current, according to the definition of a current source, is not appropriate as an infeed source for the generation of an optimum square-wave rising current ramp in the gradient coil. In the circuit described, current from the current source initially flows through an auxiliary coil, as a result of which a magnetic field is constituted therein. When the commencement of the gradient current is required, the latter is switched-on and the current in the auxiliary coil is switched-off. A high voltage is present on the auxiliary coil for a short time. As a result of the employment of the current source as a current supply, however, the energy stored in the auxiliary coil cannot flow into the gradient coil, as the output resistance of the current source is high. Charging of the gradient coil by an auxiliary inductance is not described in US 2006/0152222 A1.

A further alternative is constituted by the circuit described in U.S. Pat. No. 4,961,054. In this case, the required gradient current is supplied by an amplifier. As this current is evidently maintained at a constant value, an auxiliary coil with a 5 to 20 times higher inductance than that of the gradient coil is required. With an inductance of this magnitude, it is a very long time before the requisite current flux can be achieved, or the circuit which supplies the amplifier requires a very high maximum output voltage. Thus, in the measuring system, either a very high supply voltage for the amplifier is required, or the waiting time between two gradient pulses must be relatively long. Even in the presence of the above-mentioned conditions, it is not possible to generate an optimum pulse-shaped rising current in the gradient coil. This would require an auxiliary coil of infinite inductance, resulting in an infinite waiting time, or an amplifier with an infinite maximum output voltage. Neither is possible in practice.

U.S. Pat. No. 5,270,657 further describes a gradient system in which DC current supplies are connected in tandem with conventional linear gradient amplifiers, in order to increase the effective gradient energy supplied to the gradient coils. Here again, charging of the gradient coils by an auxiliary inductance is not described.

Finally, U.S. Pat. No. 2,941,125 discloses a circuit for the generation of currents with an optimum square-wave profile in an inductance, for the switching of a microwave device.

SUMMARY

In relation to the above, an object of the present invention is to provide a magnetic resonance device for an MR system, employing simple technical measures, in which the electric circuit for the generation of variable pulse-shaped gradient currents can generate accurately defined magnetic field gradients in an object investigated by nuclear magnetic resonance, wherein the gradient coil is brought up to the target current strength as rapidly as possible, but wherein the necessity for a high supply voltage is obviated. Accordingly, square-wave current pulses can be generated with the greatest possible accuracy, with a simultaneously short charging time of the auxiliary inductance.

These and other objects are fulfilled by the present invention in a surprisingly simple and effective manner, first, in that the electric circuit comprises at least one low-voltage voltage source for the generation of a voltage $U \leq 100V$, by which a specific voltage drop across the internal resistance of the gradient coil can be set, wherein the first auxiliary coil in the electric circuit is arranged between the voltage source and the gradient coil, in series with the gradient coil. Further, a first circuit section is present in the electric circuit, which comprises a third switching element between the voltage source and the first auxiliary coil. Furthermore, a second circuit section is present, having a fourth switching element, a second auxiliary coil, a fifth switching element arranged in series with a third resistor, and a sixth switching element arranged in series with a fourth resistor, by which a current may be generated in the gradient coil in a reverse direction to the first circuit section.

According to an object of the invention, an improved magnetic resonance device is thus proposed, in which a modified electric circuit permits a current flowing in an inductance, preferably in a gradient coil, to be brought up to the target current strength as rapidly as possible, with no requirement for the continuous delivery of a high voltage by the electric circuit which supplies the gradient current. To this end, an auxiliary inductance is provided, which can be connected in series to the gradient coil via a switch. In this circuit, the current firstly charges the auxiliary inductance and, upon the opening of the switch or the transistor, generates a very high short-term voltage on the auxiliary inductance, which results in an extremely rapid rising current ramp in the gradient coil.

The approach according to objects of the present invention involves an improved control circuit for the gradient current.

In the circuit envisaged here, a low-voltage voltage source is employed for the supply of current. The latter, according to the definition of a voltage source, has a very low output resistance. It thus delivers a virtually constant voltage, independently of the current ramp-up. It is thus possible to achieve a different current strength in the auxiliary coil and in the gradient coil, with no significant change in the voltage of the voltage source. Here, these different current strengths are achieved by the incorporation of resistors in the current paths, firstly for the auxiliary coil only, and secondly for the auxiliary coil and the gradient coil. If the current flowing in the auxiliary coil can be set such that it is greater than the desired gradient current, a low inductance can be selected for the auxiliary coil. For equal inductance values, the current flowing in the auxiliary coil must be double the gradient current, in order to achieve an optimum pulse-shaped rising current ramp in the gradient coil. If, in the circuit described here, the current flux in the auxiliary coil is switched-off, a high voltage will result on the latter. Accordingly, the gradient coil will be exposed to the sum of the supply voltage and the high voltage on the auxiliary coil, thereby resulting in a rapid rising ramp in the gradient current.

In order to maintain control of the current, a control circuit can be employed, which adjusts the supply voltage in accordance with the current strength. In this manner, variations in the gradient current, associated, e.g., with thermal effects in the current circuit, can be detected and corrected. To this end, the current to be measured is fed through a resistor, on which a voltage is then generated. This voltage is compared, by a difference amplifier, with an adjustable target value, and the voltage source is adjusted accordingly. Notwithstanding the application of a successive temporal sequence of different current strengths on the auxiliary coil and the gradient coil, and given that any resulting adjustment of the voltage source is to be prevented, the current measuring shunt is divided in accordance with the requisite current ratio. When a current flows only in the auxiliary coil, only a part of the current measuring shunt is exposed to a current flow. Whereas, in the event of a current flow in the gradient coil, both current measuring shunts are exposed to a current flow. In the circuit envisaged here, it is thus achieved that, in both cases, the same voltage is present on the input of the difference amplifier, and thus no control process ensues. Thus, the voltage on the voltage source is prevented from varying, thereby preventing any transient variation in the gradient current.

A form of embodiment of the magnetic resonance device according to an object of the invention is particularly preferred in which the voltage source is configured such that it can generate a maximum voltage U between 5V and 30V, preferably $U \leq 25V$, and specifically $U \approx 15V$. At higher voltage values, requirements for shock-hazard protection also become increasingly stringent.

Further advantageous forms of embodiments are characterized in that at least a proportion of the switching elements are configured as transistors. Rapid switching is simplified accordingly.

According to a further advantageous form of embodiment, it is provided that the first auxiliary coil and the second auxiliary coil are connected in series with the gradient coil and, according to the current direction, are arranged in mutual opposition in a reciprocal alternative circuit. The auxiliary coil delivers the requisite short-term voltage for the achievement of a rapid rising current ramp.

A preferred form of embodiment is characterized in that the inductance of the auxiliary coils lies within a range of 10 µH to 10 mH, and is preferably of the order of 100 µH. As a result of the option for an increased current flux in the auxiliary coil, the inductance rating thereof can be relatively low.

A form of embodiment is also advantageous in which a control circuit is present, which permits the setting of a desired current flux in the gradient coil and/or in the auxiliary coils. Variations, associated for example with thermal effects, can be compensated accordingly.

One class of particularly preferred forms of embodiment of the magnetic resonance device according to the invention is characterized in that, in the electric circuit, current measuring shunts and a difference amplifier are present, and in that the low-voltage voltage source is controllable, such that the magnitude of the current flow in the gradient coil can be controlled in a control loop.

Advantageous further developments of this class of forms of embodiments are characterized in that, by the control loop, the current strength can be maintained at the desired value, and specifically at a constant value. In this manner, it can be ensured that the correct current strength is present at any time.

Alternatively or additionally, in further advantageous aspects, the resistors in the electric circuit can be optimized such that, upon the switch-on of the gradient current, only a minimum voltage variation occurs on the low-voltage voltage source. It is thus achieved that only a minimum transient variation occurs in the voltage, thus permitting the generation of a virtually perfect current pulse.

A further advantageous form of embodiment of the magnetic resonance device according to the invention is characterized in that, in the electric circuit, the first electrical resistor is arranged up-circuit of the first switching element, and an electrical resistor is arranged respectively up-circuit of further switching elements such that, by the selection of the resistance ratios $R1\_a/R2\_a$ and $R1\_b/R2\_b$, the temporal characteristic of the rising current ramp in the gradient coil is influenced. In this manner, it is possible to set rising current ramps which deviate from the square-wave pulse shape.

The scope of the present invention also includes a method for the operation of the electric circuit for the generation of variable pulse-shaped currents in the gradient arrangement of a magnetic resonance device according to the above-mentioned embodiments of the invention or further developments thereof, characterized in that, firstly, prior to the commencement of a desired gradient current flux, the third switching element and the first switching element are switched to a conducting state, secondly in that, further to the achievement of the desired current strength in the first auxiliary coil and the desired current flux in the gradient coil, the second switching element is switched to a conducting state, and the first switching element is switched to a non-conducting state, and furthermore, in that, for the reverse current direction, the fourth switching element and the fifth switching element are switched to a conducting state, and lastly, in that, further to the achievement of the desired current strength in the second auxiliary coil and the desired current flux in the gradient coil, the sixth switching element is switched to a conducting state, and the fifth switching element is switched to a non-conducting state.

Further advantages of the invention emerge from the description and from the drawing. Likewise, the above-mentioned characteristics of the invention, and those described hereinafter, can respectively be employed individually or collectively, in any desired combination. The forms of embodiment represented and described are not to be understood by way of limitation, but are understood to assume an exemplary character for the representation of the invention.

BRIEF DESCRIPTION OF THE DRAWINGS

The invention is represented in the figures and the diagrams shown in the drawing, and will be described in detail with reference to exemplary embodiments.

In the drawings:

FIGS. 4A-4H show a progress chart of process steps for the operation of an electric circuit for the generation of variable pulse-shaped currents in the gradient arrangement of a magnetic resonance device according to an embodiment of the invention, together with the resulting currents in the auxiliary coil and the gradient coil for different current ratios.

DETAILED DESCRIPTION

An object of the invention is based upon a magnetic resonance device having a main field magnet for the generation of a uniform magnetic field in a measuring volume, with a gradient arrangement for the generation of magnetic field gradients in said measuring volume, incorporating at least one gradient coil G with an internal resistance Rg, and having an electric circuit for the generation of variable pulse-shaped currents through the gradient arrangement, incorporating a first switching element $Sx1\_a$ which is series-connected to a first resistor $R1\_a$, by which a current can only be switched-on or switched-off in a first auxiliary coil Ls_a, and wherein the electric circuit incorporates a second switching element $S2\_a$, by which a serial current flux can be switched through the gradient coil G and the first auxiliary coil Ls_a.

This electric circuit according to aspects of the invention is characterized in that it comprises at least one low-voltage voltage source V for the generation of a voltage $U \leq 100V$, by which a specific voltage drop across the internal resistance Rg of the gradient coil G may be set, wherein the first auxiliary coil Ls_a in the electric circuit is arranged between the voltage source V and the gradient coil G, in series with the gradient coil G, wherein a first circuit section is present in the electric circuit, which comprises a third switching element $S1\_a$ between the voltage source V and the first auxiliary coil Ls_a, and wherein a second circuit section is present, having a fourth switching element $S1\_b$, a second auxiliary coil Ls_b, a fifth switching element $Sx1\_b$ arranged in series with a third resistor $R1\_b$, and a sixth switching element $S2\_b$ arranged in series with a fourth resistor $R2\_b$, by which it is possible to generate a current in the gradient coil G in a reverse direction to the first circuit section.

Figure 1:
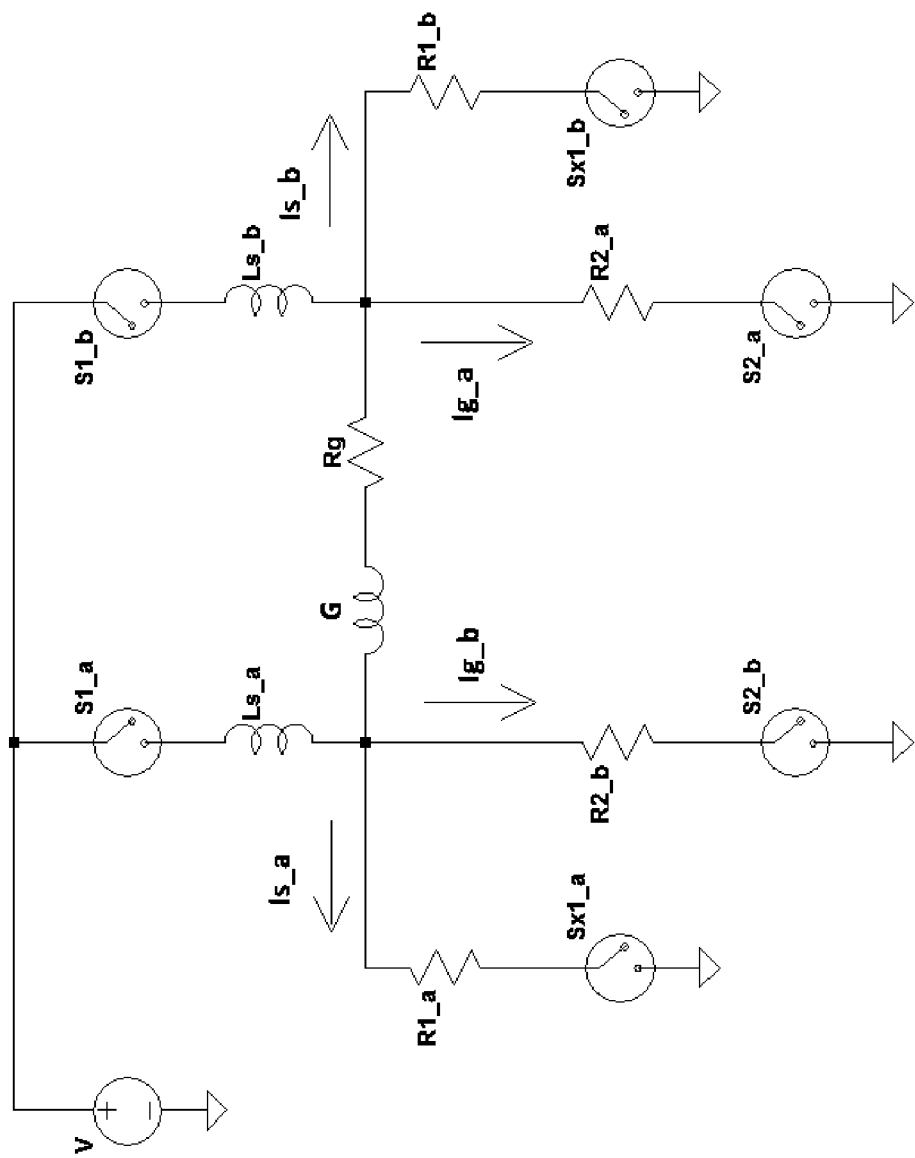
FIG. 1 shows a schematic representation of an electric circuit according to a first simplified form of an embodiment of the invention.

In the circuit represented in FIG. 1, a simplified form of an embodiment of the invention is shown.

The voltage generated by the low-resistance voltage source V is continuously present on the circuit. The voltage U of this voltage source V determines the ultimate flux of the gradient current $Ig=U/R$.

Here, $R=Rg+R2\_a$ or $R=Rg+R2\_b$, depending upon the polarity of the desired gradient current.

Figure 3A:
FIGS. 3A-3C show a schematic diagram of the temporal sequence of trigger pulses for the general current flux (FIG. 3A), the current flux in the auxiliary coil (FIG. 3B), and the current flux in the gradient coil (FIG. 3C).
Figure 3B:
Figure 3C:

By a controllable voltage source, the magnitude of the gradient current can thus be controlled. Shortly before the current pulse in the gradient coil G is required, the switching elements $S1\_a$, $Sx1\_a$ or, alternatively, depending upon the desired current direction, $S1\_b$, $Sx1\_b$ are switched to a conducting state. This is represented in FIGS. 3A-3C by FIG. 3A for $S1\_a$ or, alternatively, $S1\_b$ and by FIG. 3B for the switching element $Sx1\_a$ or, alternatively, $Sx1\_b$.

After a short time, which is determined inter alia by the inductance of the auxiliary coil Ls_a or, alternatively, Ls_b, a constant current flux is set in the auxiliary coil Ls_a or, alternatively, Ls_b, which is determined inter alia by the resistor R1_a or, alternatively, R1_b and the output voltage of the voltage source V. This is represented by the curves shown in FIGS. 4C, 4E and 4G.

If the current pulse is required in the gradient coil G, the switching element S2_a or, alternatively, S2_b is switched to a conducting state and, simultaneously, Sx1_a or, alternatively, Sx1_b is switched to a non-conducting state. This is represented by FIGS. 3B and 3C, in the form of the varying level of the trigger voltage.

In FIG. 4A, the temporal characteristic of these switching processes for Sx1_a or, alternatively, Sx1_b, and in FIG. 4B that of the switching element S2_a or, alternatively, S2_b, are represented. By switching to the "non-conducting" state, on the auxiliary coil Ls_a or, alternatively, Ls_b, and thus also on the gradient coil G, a short-term voltage spike is generated, which ensures that the current flowing in the gradient coil G rises extremely rapidly. If the ratio of the inductances Ls of the auxiliary coil Ls_a or, alternatively, Ls_b to the inductance Lg of the gradient coil G has been favourably selected such that, for example, Ls=Lg by the selection of the resistor R1_a or, alternatively, R1_b, the current flowing in the auxiliary coil Ls_a or, alternatively, in Ls_b, in the time interval prior to the gradient current pulse, can be set such that said current, in this example, corresponds to double the value of the gradient current pulse. This combination provides the best possible approximation to a square-wave pulse shape of the gradient current. For this gradient current pulse shape, the following general formula applies:

$$Is/Ig=(Ls+Lg)/Ls$$

where Is is the current flowing in an auxiliary coil of inductance Ls, and Ig is the desired gradient current flowing in the gradient coil with the inductance Lg.

Where values are applied which deviate from the equation, the current pulse shapes represented in the diagram according to FIGS. 4A-4H are possible. FIGS. 4C, 4E and 4G represent the current characteristic in the auxiliary coil for different settings of the currents Is_a or, alternatively, Is_b. FIG. 4C represents a larger current, FIG. 4E represents the optimum current, and FIG. 4G represents a smaller current than that required for the generation of a square-wave current pulse. The curves in FIGS. 4D, 4F and 4H represent the resulting gradient current characteristics.

The resistors R2_a and R2_b are necessary, if the internal resistance of the gradient coil is so low that the voltage of the voltage source V, at the desired gradient current, becomes very small. This voltage should ideally be >5V, in order to ensure the effective operation of the circuit.

Figure 2:
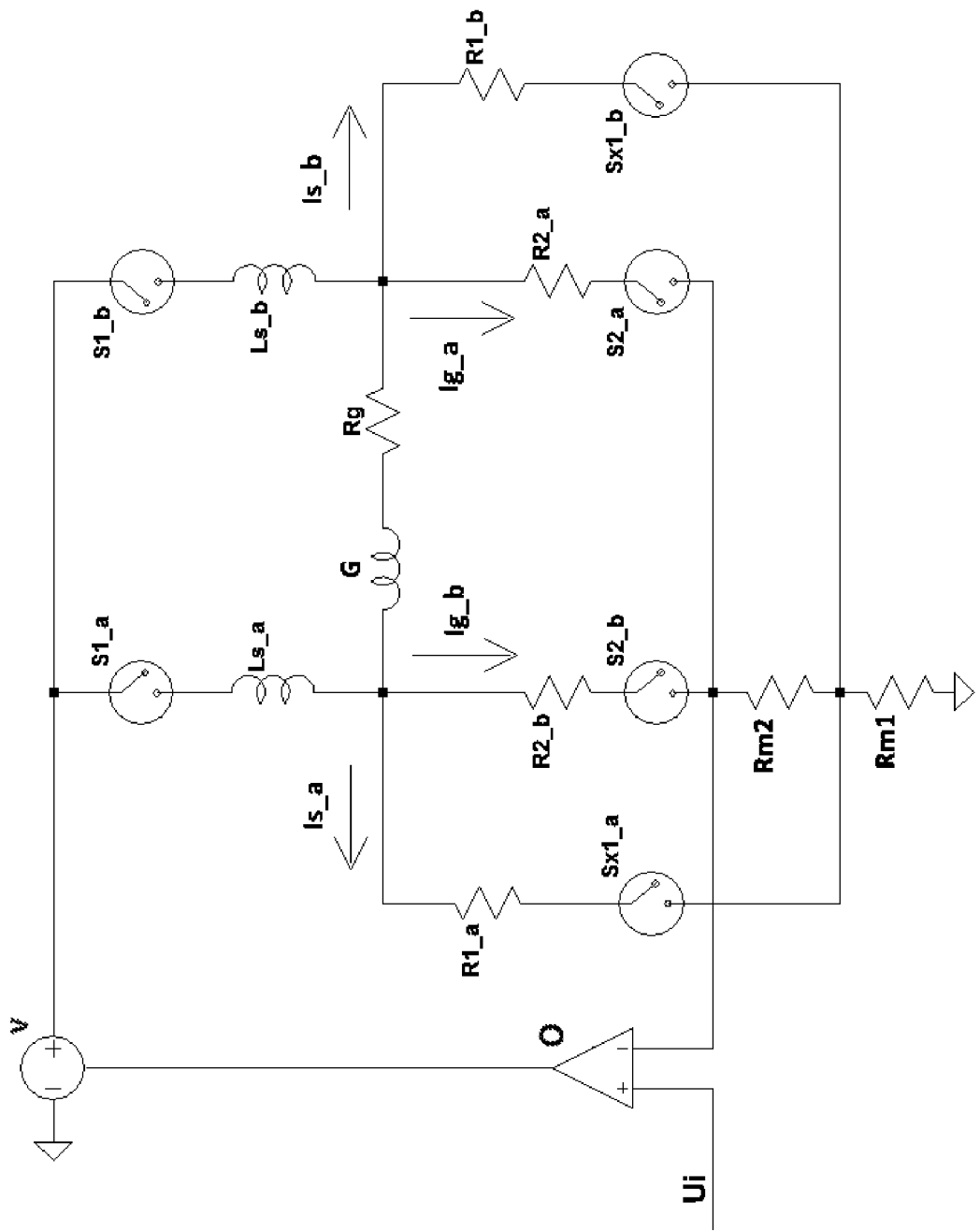
FIG. 2 shows a schematic representation of an electric circuit according to a second form of an embodiment of the invention, with a difference amplifier.

In the circuit represented in FIG. 2, a form of the invention is embodied in which the voltage source V is regulated in accordance with the actual gradient current flowing.

Here, the voltage source is regulated by a differential amplifier O. This compares the voltage Ui, at which the magnitude of the gradient current can be set, with the voltage on the current measuring shunts Rm1 and Rm2, and endeavors to set the voltage source V such that equality exists between the voltages.

If, in this circuit, all the switching elements are switched-off, such that no current flows, the voltage on the voltage source V is set by the difference amplifier O to the maximum voltage. However, immediately, in the short time interval prior to the gradient current pulse, a current flows in the auxiliary coil Ls_a or, alternatively, Ls_b and in the switching elements S1_a, Sx1_a or, alternatively, S1_b, Sx1_b, the current control circuit is active, and the output voltage of the voltage source V is set such that the same voltage is present on the resistor Rm1 as that dictated by Ui.

Although the process for the setting of the current requires a certain amount of time, this can be encompassed by the charging time of the auxiliary coil Ls_a or, alternatively, Ls_b. The manner in which the current flux is constituted is entirely non-critical, as it is only necessary to ensure that, at the time of switchover, the requisite charging current flows in one of the auxiliary coils Ls_a or, alternatively, Ls_b.

The switch-on of the gradient current proceeds as described with reference to circuit 1. After the switchover, the gradient current flows in Rm1 and Rm2, resulting in the generation of a voltage therein which is routed to the differential amplifier O. This adjusts the voltage source V such that equality exists with Ui, and the desired gradient current flows accordingly. In order to prevent any resetting of the control circuit at the time of switchover, the current measuring shunts Rm1 and Rm2 should be selected such that, on the input of the differential amplifier O, there is no voltage variation. Any time requirement for the resetting of current, and any variation in the gradient current Ig during this time, are prevented accordingly. In the present example, this applies where the resistance values of Rm1 and Rm2 are equal. Depending, inter alia, upon Is_a, Is_b, the gradient current Ig, Ls_a, Ls_b and the inductance Lg of the gradient coil G, however, other resistance ratios are also possible.

In consideration of all the internal resistances of the current path for Is_a, Is_b and Ig, including inter alia the switching elements, the auxiliary coils, the gradient coil G, the voltage source V and the resistors Rm1 and Rm2, the resistances R1_a, R2_a, R1_b and R2_b can be selected such that, notwithstanding any minor voltage variation on the voltage source V at the time of switchover, there is no influence on the ratio Is_a/Ig or, alternatively, Is_b/Ig. This also improves the pulse shape of the gradient current Ig.

The circuit according to objects of the invention is thus comprised, in principle, of a series circuit of a low-voltage voltage source, an auxiliary inductance and a primary inductance, and a control circuit, by which it is possible to set the desired current flowing in the inductances. In this circuit, the current initially charges the auxiliary inductance and, upon the opening of the control circuit (transistors), a very high short-term voltage is generated across the auxiliary inductance, resulting in a very rapid current rise in the primary inductance.

In many circuits according to the prior art, the employment of high voltages is a significant disadvantage. In other circuits according to the prior art, a current source is employed to deliver current for the gradient current, which invariably requires a current control process at the origin of the gradient current flux. By the circuit described according to the invention, a rapid and steep-fronted gradient current pulse can be generated, even at low service voltages of, e.g., 5V.

In an auxiliary inductance, energy is stored which, at the required time, is employed for the achievement of a very rapid rising current ramp in the primary inductance, without the necessity of a high-voltage supply for this purpose. Variation in the current strength of the pulse is achieved by a current control circuit only.

Typical values of the primary inductance for application as a gradient coil in MR systems can range from several tens of μH up to the order of a mH. The circuit can preferably be employed for voltages between 5 and 30V, and for current strengths ranging from a few mA up to, e.g., 100 A, wherein any limit is only dictated by the technical specifications of the components employed.

FIGS. 3A-3C show an exemplary temporal sequence of trigger pulses for the switching elements in which the above-mentioned method according to the invention is executed:

FIG. 3A shows current on: S1_a or, alternatively, S1_b are employed to determine the direction of current flow in the gradient coil.

FIG. 3B shows charging of auxiliary coil: Sx1_a or, alternatively, Sx1_b, in the conducting state, permit the flow of a charging current in an auxiliary coil Ls_a or, alternatively, Ls_b.

FIG. 3C shows a gradient current on: S2_a or, alternatively, S2_b, in the conducting state, permit the flow of current in the gradient coil.

Finally, FIGS. 4A-4H shows a temporal progress chart of process steps for the operation of an electric circuit for the generation of variable pulse-shaped currents in the gradient arrangement of a magnetic resonance device according to the invention:

FIG. 4A shows a trigger voltage of Sx1_a or, alternatively, Sx1_b.

FIG. 4B shows a trigger voltage of S2_a or, alternatively, S2_b.

FIG. 4C shows a current characteristic in the auxiliary coil Ls_a or, alternatively, Ls_b, where the current is greater than that required for a square-wave rising current ramp.

FIG. 4D shows a current characteristic in the gradient coil, where the charging current is greater than that required for a square-wave rising current ramp.

FIG. 4E shows a current characteristic in the auxiliary coil Ls_a or, alternatively, Ls_b, where the current is of the magnitude required for a square-wave rising current ramp.

FIG. 4F shows a current characteristic in the gradient coil, where the charging current is of the magnitude required for a square-wave rising current ramp.

FIG. 4G shows a current characteristic in the auxiliary coil Ls_a or, alternatively, Ls_b, where the current is smaller than that required for a square-wave rising current ramp.

FIG. 4H shows a current characteristic in the gradient coil, where the charging current is smaller than that required for a square-wave rising current ramp.

The method according to aspects of the invention is employed for the operation of an electric circuit for the generation of variable pulse-shaped currents in the gradient arrangement of a correspondingly modified magnetic resonance device, characterized in that, initially, prior to the commencement of a desired gradient current flux, the third switching element S1_a and the first switching element Sx1_a are switched to a conducting state, in that, further to the achievement of the desired current strength Is_a in the first auxiliary coil Ls_a and the desired current flux in the gradient coil G, the second switching element S2_a is switched to a conducting state, and the first switching element Sx1_a is switched to a non-conducting state, in that, for the reverse current direction, the fourth switching element S1_b and the fifth switching element Sx1_b are switched to a conducting state, and in that, further to the achievement of the desired current strength Is_b in the second auxiliary coil Ls_b and the desired current flux in the gradient coil G, the sixth switching element S2_b is switched to a conducting state, and the fifth switching element Sx1_b is switched to a non-conducting state.

LIST OF REFERENCE SYMBOLS

V Low-voltage voltage source
Ui Voltage
G Gradient coil
Ig_a First gradient current
Ig_b Second gradient current
Is_a Current in first auxiliary coil
Is_b Current in second auxiliary coil
Rg Internal resistance of the Gradient coil
Sx1_a First switching element
S2_a Second switching element
S1_a Third switching element
S1_b Fourth switching element
Sx1_b Fifth switching element
S2_b Sixth switching element
R1_a First resistor
R2_a Second resistor
R1_b Third resistor
R2_b Fourth resistor
Rm1 First current measuring shunt
Rm2 Second current measuring shunt
Ls_a First auxiliary coil
Ls_b Second auxiliary coil

What is claimed is:

1. A magnetic resonance device comprising a main field magnet for generating a uniform magnetic field in a measuring volume, with a gradient arrangement for generating magnetic field gradients in the measuring volume, incorporating at least one gradient coil with an internal resistance, and an electric circuit for generating variable pulse-shaped currents through the gradient arrangement, wherein the electric circuit comprises:
   a first switching element, which is series-connected to a first resistor, by which a current is switched-on or switched-off only in a first auxiliary coil;
   a second switching element, which is series-connected to a second resistor, for switching a first serial current flux through the gradient coil and the first auxiliary coil;
   at least one low-voltage voltage source for generating a voltage U≤100V, by which a specific voltage drop across the internal resistance of the gradient coil is set, wherein the first auxiliary coil in the electric circuit is arranged between the voltage source and the gradient coil and is arranged in series with the gradient coil; and
   a first circuit section and a second circuit section,
   wherein the first circuit section comprises a third switching element between the voltage source and the first auxiliary coil, and
   wherein the second circuit section comprises a fourth switching element arranged in series with a second auxiliary coil, a fifth switching element arranged in series with a third resistor, and a sixth switching element arranged in series with a fourth resistor for switching a further serial current flux through the gradient coil in a reverse direction to the first serial current flux.

2. The magnetic resonance device according to claim 1, wherein the voltage source is configured to generate a maximum voltage U between 5V and 30V.

3. The magnetic resonance device according to claim 1, wherein at least a portion of the switching elements are configured as transistors.

4. The magnetic resonance device according to claim 1, wherein the first auxiliary coil and the second auxiliary coil are connected in series with the gradient coil and, with reference to a current direction of the first circuit section, are arranged in mutual opposition to generate a reciprocal alternative circuit.

5. The magnetic resonance device according to claim 1, wherein an inductance of the first auxiliary coil and the second auxiliary coil lies within a range of 10 µH to 10 mH.

6. The magnetic resonance device according to claim 1, wherein a control circuit is configured to set a desired current flux in the gradient coil and/or in the first auxiliary coil and the second auxiliary coil.

7. The magnetic resonance device according to claim 1, further comprising current measuring shunts, and a difference amplifier, and wherein the low-voltage voltage source is controllable, such that a magnitude of a current flow in the gradient coil is controlled by a control loop.

8. The magnetic resonance device according to claim 7, wherein the control loop is configured to maintain a current strength at a desired value and at a constant value.

9. The magnetic resonance device as claimed in claim 7, wherein the first resistor, the second resistor, the third resistor, and the fourth resistor in the electric circuit are optimized such that, upon switch-on of a gradient current, a minimum voltage variation occurs on the low-voltage voltage source.

10. The magnetic resonance device according to claim 1, wherein, in the electric circuit, the first resistor is arranged up-circuit of the first switching element, the second resistor is arranged up-circuit of the second switching element, the third resistor is arranged up-circuit of the third switching element, and the fourth resistor is arranged up-circuit of the fourth switching element such that by selection of a first resistance ratio between the first resistor and the second resistor ($R1\_a/R2\_a$) and a second resistance ratio between the third resistor and the fourth resistor ($R1\_b/R2\_b$), a temporal characteristic of a rising current ramp in the gradient coil is set.

11. A method for operating an electric circuit for generating variable pulse-shaped currents in a gradient arrangement of a magnetic resonance (MR) device comprising:

switching, prior to commencement of a desired gradient current flux, a first switching element and a third switching element to a conducting state, wherein the third switching element is positioned between a low-voltage voltage source and a first auxiliary coil, and wherein the first switching element is series-connected to a first resistor, by which a current is switched-on or switched-off only in the first auxiliary coil;

switching a second switching element to a conducting state and the first switching element to a non-conducting state to achieve a desired current strength in the first auxiliary coil and a desired current flux in a gradient coil, wherein the second switching element is connected in series to a second resistor and configured to switch a serial current flux through the gradient coil and the first auxiliary coil, wherein the first auxiliary coil is arranged between the low-voltage voltage source and the gradient coil, and is in series with the gradient coil; and switching, to achieve a reverse current direction, a fourth switching element and a fifth switching element to a conducting state, wherein the fourth switching element is arranged in series with a second auxiliary coil, and the fifth switching element is arranged in series with a third resistor; and switching a sixth switching element to a conducting state, and the fifth switching element to a non-conducting state, wherein the sixth switching element is arranged in series with a fourth resistor, to achieve a further desired current strength in the second auxiliary coil and a further desired current flux in the gradient coil.

12. The magnetic resonance device according to claim 2, wherein $U \leq 25V$.

13. The magnetic resonance device according to claim 2, wherein $U \approx 15V$.

14. The magnetic resonance device according to claim 5, wherein the inductance is of the order of 100 µH.

15. The method of claim 11, wherein the at least one low-voltage voltage source generates a voltage of $U \leq 100V$.

* * * * *